US012780076B2

(12) United States Patent
Bynon et al.

(10) Patent No.: US 12,780,076 B2
(45) Date of Patent: Nov. 3, 2026

(54) SYSTEMS AND METHODS FOR VIRTUALLY RECONSTRUCTING A MISSION OF A LIQUID-DISPENSING VEHICLE

(71) Applicant: Caterpillar Inc., Peoria, IL (US)

(72) Inventors: Carrie-Ann Bynon, Bradford (AU); Jan Sobus, Burpengary East (AU); Evgeny Chishko, Annerley (AU)

(73) Assignee: Caterpillar Inc., Peoria, IL (US)

( * ) Notice: Subject to any disclaimer, the term of this patent is extended or adjusted under 35 U.S.C. 154(b) by 516 days.

(21) Appl. No.: 18/237,810

(22) Filed: Aug. 24, 2023

(65) Prior Publication Data

US 2025/0065793 A1 Feb. 27, 2025

(51) Int. Cl.
*G06F 11/30* (2006.01)
*B60P 3/22* (2006.01)
(Continued)

(52) U.S. Cl.
CPC ............. *B60P 3/2245* (2013.01); *B60P 3/228* (2013.01); *G06F 30/20* (2020.01)

(58) Field of Classification Search
CPC ........ B60P 3/2245; B60P 3/228; G06F 30/20; E01C 19/17; E01C 19/004; E01H 3/02
See application file for complete search history.

(56) References Cited

U.S. PATENT DOCUMENTS 8,360,343 B2 1/2013 Gudat et al.
8,378,833 B2 * 2/2013 Miller .................. G01F 23/802 340/625
(Continued)

FOREIGN PATENT DOCUMENTS

CN 105261229 1/2016
CN 104153279 B 2/2019
(Continued)

OTHER PUBLICATIONS

Written Opinion and International Search Report for Int'l. Patent Appln. No. PCT/US2024/038143, mailed Oct. 31, 2024 (87 pgs).

*Primary Examiner* — Erin M Piateski
*Assistant Examiner* — Hajar Hassaniardekani

(57) ABSTRACT

A liquid-dispensing vehicle, such as a water truck, may deliver water from a tank through spray heads to combat dust at a worksite during a mission. Operating in an environment with potentially low-bandwidth and intermittent communications, the vehicle periodically transmits time-stamped data relating to a tank level, truck movement, and a binary status of the spray heads to an external computing system. The computing system virtually reconstructs the operation of the truck and treatment of the worksite by building timelines and coverage maps from the timestamped data. In generating a smoothed water-level timeline, the system identifies refilling sections, stable sections, and draining sections of the tank from the timestamped data and filters noisy water readings during the draining sections. An activity timeline identifies various truck activities during the watering mission, and a coverage map builds a two-dimensional rendering of water treatment on the worksite based on geometric patterns of the active spray heads, all of which may be used to evaluate the mission or to control future operation of the vehicle.

20 Claims, 8 Drawing Sheets

(51) Int. Cl.
*G06F 17/00* (2019.01)
*G06F 30/20* (2020.01)

(56) References Cited

U.S. PATENT DOCUMENTS

| | | | | |
|---|---|---|---|---|
| 8,770,125 | B2 | 7/2014 | Guerrier | |
| 9,766,637 | B2 | 9/2017 | Kou et al. | |
| 11,609,966 | B2 * | 3/2023 | Kim | G01C 13/008 |
| 2010/0145638 | A1 * | 6/2010 | Begin | G01F 23/804 702/55 |
| 2013/0099017 | A1 * | 4/2013 | Gudat | E21F 5/02 239/1 |
| 2015/0233245 | A1 * | 8/2015 | Sheehan | E21F 5/00 700/283 |
| 2020/0326221 | A1 * | 10/2020 | Arreaza | G01F 22/00 |

FOREIGN PATENT DOCUMENTS

| | | | |
|---|---|---|---|
| CN | 111612997 | A | 9/2020 |
| CN | 111984933 | A | 11/2020 |
| CN | 113812920 | A | 12/2021 |
| CN | 115727091 | A | 3/2023 |
| JP | 2020070034 | A | 5/2020 |
| KR | 102519606 | B1 | 4/2023 |

* cited by examiner

500

600

SYSTEMS AND METHODS FOR VIRTUALLY RECONSTRUCTING A MISSION OF A LIQUID-DISPENSING VEHICLE

TECHNICAL FIELD

The present disclosure relates to systems and methods for virtually reconstructing the performance of a liquid-dispensing vehicle on a mission around a worksite. More specifically, the present disclosure relates to a water truck communicating limited operational data during a watering mission to a computer system configured to graphically reconstruct behavior of the water truck using status and activity timelines and a water-coverage map.

BACKGROUND

Worksites in rugged environments, such as in the mining or construction industries, often have unpaved paths for work equipment to travel and exposed terrain where the work occurs. Traffic from the work equipment on the unpaved paths can lead to dust and small particulates being churned into the air. In addition, operations at the worksite may involve digging, cutting, or scraping the exposed terrain, contributing additional dust to the air. This airborne debris may decrease visibility, presenting a work hazard for personnel on foot and within the work equipment. Depending on the location and the composition of the terrain, the dust may also pose a health risk if inhaled.

To combat the risks from airborne dust at worksites, the unpaved paths and their surrounding areas may be dampened with water or other liquids using water trucks. The water helps keep dust on the ground and, when sprayed, may take some of the dust out of the air. The water trucks typically contain a large tank holding the water, a variety of spray heads positioned around the truck, a cannon or hose for directed spraying, and a trailing dump bar for releasing water by gravity. Some water trucks are essentially autonomous with programmed routes, dispensing plans, and diagnostic features. Most water trucks, however, are manually operated and controlled with limited automated features to ease operation, improve safety, and conserve water.

Diagnostic information available off-board from a non-autonomous water truck during a watering mission is typically very limited. Often, that data, which may be communicated telemetrically during the mission, includes a signal indicating the water level in the tank, signals indicating which of the spray heads or cannon are active, and the hose-reel pressure. The water-level signal arises from a pressure sensor within the tank, and any movement of the truck or disturbance of the water from refilling or dispensing, possibly to the point of sloshing, leads to a noisy and unreliable water-level signal. Further, the signals relating to the spray elements are binary and indicate which have been active at a point in time, but they do not provide useful watering data. Therefore, the diagnostic information provided off-board is often unreliable for making efficient use of the water truck during a current or future mission or work cycle.

In addition, communication of diagnostic information from a water truck is limited and may be sporadic. The data may be captured at a relatively slow frequency, such as at 1 Hz, which can result in an unclear representation of truck activity. Also, in some remote worksites as in the mining industry, wireless communications with a moving vehicle are intermittent and unreliable. As a result, a network may receive batches of the diagnostic information not in real time.

One arrangement for detecting activity of a watering truck in remote locations is described in U.S. Pat. No. 9,766,637 ("the '637 patent"). The '637 patent describes a system for determining a speed limit for a mining machine along a travel path that may have been moistened by a water truck. The water truck communicates positional and watering data to the system. The system can estimate an amount of watering applied per unit area based on data from the truck indicating a watering flow rate, a duration of watering, and a speed of the truck. Directed to estimating an amount of moisture on a path, however, the system of the '637 patent does not address inaccuracies in water-level readings caused by movement or sloshing in a water truck or attempt to virtually reconstruct timelines or watering patterns performed by the truck. As a result, the system of the '637 patent is not desirable for capturing and assessing performance of a water truck during a mission within a work site.

Examples of the present disclosure are directed to overcoming deficiencies of such systems.

SUMMARY

In an aspect of the present disclosure, a system for virtually reconstructing a watering mission includes a liquid-dispensing vehicle and a computing system. The liquid-dispensing vehicle includes a tank holding a liquid, dispensing elements configured to dispense the liquid into atmosphere above a worksite external to the vehicle, and a control system configured to coordinate operation of the liquid-dispensing vehicle. The control system includes a navigation system configured to detect a location and movement of the liquid-dispensing vehicle within the worksite and a sensor system configured to sense parameters associated with the liquid-dispensing vehicle, where the parameters include a tank reading indicative of a level of the liquid in the tank, a status of the dispensing elements, and a slope of the liquid-dispensing vehicle. The control system further includes a communication system configured to transmit the parameters with a timestamp. The computing system includes a smoothing engine configured to virtually reconstruct a smoothed water-level timeline from a batch of the parameters having different timestamps, where the smoothed water-level timeline includes a refilling section, a stable section, and a draining section. With the smoothing engine, the draining section may be adjusted by the slope of the liquid-dispensing vehicle and may be processed by a smoothing filter. The computing system further includes one or more processors configured to receive the batch of the parameters from the communication system and to execute the smoothing engine to virtually reconstruct the smoothed water-level timeline for the liquid-dispensing vehicle.

In another aspect of the present disclosure, a computer-implemented method includes receiving periodically, by a computing system and from a water truck, data snapshots for parameters of the water truck during a watering mission, where each of the data snapshots includes a timestamp, a tank reading of a water level in a tank of the water truck, water-activity data indicative of a status of water-dispensing elements on the water truck, and movement data indicative of a location and movement of the water truck. The method further includes determining a slope of the water truck from movement data, constructing an initial water-level timeline from the data snapshots based, at least in part, on the timestamp and the tank reading in each of the data snapshots, and identifying sections of the initial water-level timeline from the water-activity data and the movement data, where the sections include a refilling section, a stable section, and a draining section. The method further includes maintaining the tank reading within the refilling section and the tank reading within the stable section, respectively, for the initial water-level timeline, and adjusting the initial water-level timeline for the draining section according to the slope of the water truck to produce an adjusted draining section. In addition, the method involves applying a smoothing filter to the adjusted draining section to produce a smoothed draining section, generating a smoothed water-level timeline from the initial water-level timeline and the smoothed draining section, and transmitting the smoothed water-level timeline to one of a display device or the water truck for controlling the water truck in a new watering mission.

In yet another aspect of the present disclosure, a non-transitory computer-readable storage medium has instructions stored thereupon that are executable by one or more processors and which, when executed, cause the one or more processors to receive periodically, from a water truck, data snapshots for parameters of the water truck during a watering mission. Each of the data snapshots includes a timestamp, a tank reading of a water level in a tank of the water truck, water-activity data indicative of a status of water-dispensing elements on the water truck, and movement data indicative of a location and movement of the water truck. The instructions cause the one or more processors further to determine a slope of the water truck from movement data, construct an initial water-level timeline from a batch of the data snapshots based, at least in part, on the timestamp and the tank reading for each of the data snapshots, and identify sections of the initial water-level timeline from the water-activity data and the movement data. The sections may include a refilling section, a stable section, and a draining section. The instructions further cause the one or more processors to maintain the tank reading as a value of the initial water-level timeline for the refilling section and for the stable section, adjust the initial water-level timeline for the draining section according to the slope of the water truck to produce an adjusted draining section, and filtering the adjusted draining section to produce a smoothed water-level timeline for the water level in the tank during the watering mission. Finally, the one or more processors transmit the smoothed water-level timeline to one of a display device or the water truck for controlling the water truck in a new watering mission.

BRIEF DESCRIPTION OF DRAWINGS

The detailed description references the accompanying figures. In the figures, the left-most digit of a reference number identifies the figure in which the reference number first appears. The same reference numbers indicate similar or identical items.

DETAILED DESCRIPTION

Consistent with the principles of the present disclosure, a liquid-dispensing vehicle, such as a water truck, may deliver water from a tank through spray heads to combat dust at a worksite during a mission. Operating in an environment with potentially low-bandwidth and intermittent communications, the vehicle periodically transmits timestamped data relating to a tank level, truck movement, and a binary status of the spray heads to an external computing system. The computing system virtually reconstructs the operation of the truck and treatment of the worksite by building timelines and coverage maps from the timestamped data. In generating a smoothed water-level timeline, the system identifies different sections of the timeline based on perceived activities by the vehicle. The sections may include, among others, a refilling section when liquid is added to the tank, a stable section when the vehicle is stopped for a period without being refilled or dispensing liquid, and a draining section when the truck is dispensing liquid while moving. The computing system adjusts the draining sections based on a grade or slope of the vehicle and filters noisy water readings during those sections. Further, an activity timeline built by the computing system identifies various truck activities during the watering mission, and a coverage map generates a two-dimensional rendering of water treatment on the worksite based on geometric spray patterns of the active spray heads. The reconstructed timelines and the coverage map may be used to evaluate the mission or to control future operation of the vehicle. The following describes several examples for carrying out the principles of this disclosure.

Figure 1:
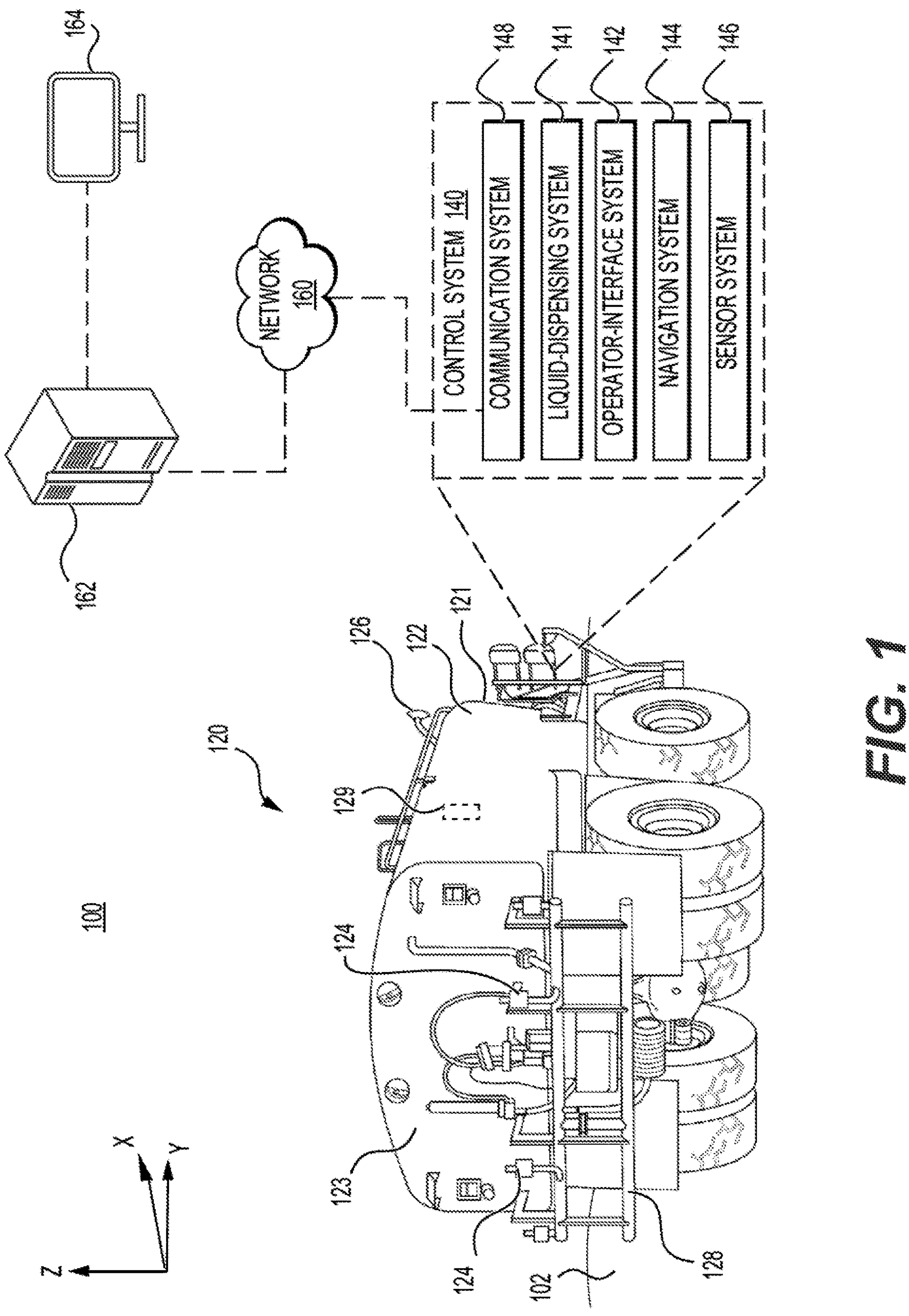
FIG. 1 is a schematic view of a generalized system for virtually reconstructing a mission of a liquid-dispensing vehicle in accordance with an example of the present disclosure.

FIG. 1 illustrates an exemplary system 100 in which a representative water truck 120 operates. As shown in FIG. 1, water truck 120 functions within a worksite 102, which may be a surface mine site within the mining industry, a logging worksite within the timber industry, a building site within the construction industry, or any other environment where watering operations may be used. Within system 100, the conditions of the soil and operations of equipment and personnel within the area may generate loose dirt and other light particulates, generally termed "dust" in the present disclosure, that float in the air. This dust may impair visibility, reduce air quality for the operation of equipment, and present a health hazard for personnel. In some examples, system 100 is in a remote geographic location having little pavement or development beyond its natural state.

The water truck 120 in FIG. 1 is a representative vehicle for holding, transporting, and dispensing liquid to the surface of worksite 102. The liquid handled by water truck 120 may be any liquid composition suitable and desired for spreading on the surface of worksite 102. For simplicity, this disclosure refers to the liquid as "water" and the vehicle as a "water truck," although water truck 120 is not intended to be limited to handling pure water and operates as a liquid-dispensing vehicle for any liquid. While not shown in FIG. 1, system 100 includes roadways or travel paths for water truck 120 to traverse while dispensing (i.e., spraying) water on the ground about the truck. Within worksite 102, the paths may be haul routes that are typically not paved or otherwise covered or treated, leading to a need to protect them from the rise of dust by traffic from work equipment within the worksite.

Consistent with the principles of the present disclosure, water truck 120 is a work machine operating as a truck with a front 121 and a rear 123, an engine (not shown) for providing propulsion and other power, a tank 122 for storing water, spray heads 124 for dispensing pressurized water in spray patterns, a cannon 126 for directing pressurized water at a narrow target, and a dump bar 128 for releasing unpressurized water under the force of gravity behind the truck. These structures and dispensing elements within water truck 120 are exemplary only. Other dispensing elements may be included within water truck 120, or the functions of existing equipment altered, without deviating from the concepts addressed in the present disclosure. While not elaborated, water truck 120 may include other equipment associated with the storage and delivery of water, such as hydraulic elements for pumping, pressurizing, and dispensing the water from the truck, along with pipes, hoses, pumps, valves, and associated equipment.

The water truck 120 may include a control system 140 typically with digital logic, electronic processing, hydraulic actuation, and similar capabilities, configured to manipulate, control, and monitor the activities of the truck. At the least, the activities may include the truck traveling along paths within worksite 102 and dispensing water from tank 122, either while traveling or while stopped. In examples, subsystems within control system 140 include a liquid-dispensing system 141, an operator-interface system 142, a navigation system 144, a sensor system 146, and a communication system 148.

The liquid-dispensing system 141 within control system 140 is configured to deliver liquid, typically water, to the surface of worksite 102. The liquid-dispensing system 141 may include a hydraulic system (not shown) configured to pump water from tank 122 to spray heads 124, which may spray or otherwise release the water into the surrounding atmosphere and onto the surface of worksite 102. The liquid-dispensing system 141 may include a liquid-dispensing controller (not shown), such as a specialized electronic control unit, configured to control the functions of liquid-dispensing system 141 to spray the water based on commands received from control system 140. For example, based on the commands received via control system 140, liquid-dispensing system 141 may spray water onto worksite 102 at a commanded rate (e.g., liters per minute or liters per square meter per minute), in a commanded amount (e.g., liters or liters per square meter), and/or with a commanded spray or pattern. For example, liquid-dispensing system 141 may vary the spray rate, width, distribution, direction, and/or pattern of water delivered from the truck. The distribution and direction may be altered to match the width or size of the roadway or path within worksite 102 or to avoid spraying water on objects along the path. For instance, certain ones of spray heads 124 may be turned off to avoid oncoming traffic or nearby personnel. Different combinations of spray heads 124 and dump bar 128 may also be activated to achieve a desired distribution pattern.

The liquid-dispensing system 141 may be controlled by an operator of the truck through operator-interface system 142. The operator-interface system 142 may include any components or systems for receiving input from, and/or providing output to, the operator of water truck 120. For example, operator-interface system 142 may include one or more displays, monitors, touchscreens, keypads, keyboards, levers, joysticks, wheels, pedals, and similar devices. In some configurations, operator-interface system 142 may enable the operator to manipulate delivery of water through spray heads 124, cannon 126, and dump bar 128. Further, operator-interface system 142 may enable the operator to dispense water in an auto mode where delivery of water occurs according to a predetermined rate and may be tied to the speed of water truck 120. Thus, in auto mode, water delivery may cease when water truck 120 slows below a fixed speed to avoid wasting water while the truck is slowed or stopped. Or the operator may select a manual mode where delivery of water occurs under the discretion of the operator.

The navigation system 144 may include any components or systems for semiautonomous and/or operator-assisted direction or control of water truck 120. For example, navigation system 144 may include a Global Positioning System (GPS) or a Global Navigation Satellite System (GNSS), an obstacle detection and avoidance system, an electronic engine control module, an electronic transmission control module, a steering control module, and/or other devices or systems configured to provide instructions to other systems of water truck 120 to control at least some aspects of navigating worksite 102. Navigation system 144 may be configured to instruct water truck 120 to travel a certain path or route, and/or to perform a certain task based on instructions received from control system 140, with or without the assistance of an operator of water truck 120.

Additionally, water truck 120 includes one or more sensors within sensor system 146 configured to sense or measure parameters associated with water truck 120 and to generate corresponding signals indicative of values of the sensed parameters. Generally, and as discussed in detail below, the information gathered by the onboard sensors may reflect the status and operations of water truck 120 and may be used to assess the performance and behavior of water truck 120 during a mission of the vehicle in dispensing liquid along a route within worksite 102. For example, sensor system 146 may include a location device (not shown) configured to determine a real-time location of water truck 120 on worksite 102. The location device may include a Global Positioning System (GPS) device, a Global Navigation Satellite Systems (GNSS) device, a laser range finder device, an Inertial Reference Unit (IRU), or an odometric or dead-reckoning positioning device. In some examples, the location device may provide the latitude and longitude coordinates corresponding to the current location of water truck 120.

The sensor system 146 may further include an orientation sensor (not shown) configured to determine a heading, direction, and/or inclination of water truck 120 on the surface of worksite 102. The orientation sensor may include, for example, a laser-level sensor, a tilt sensor, inclinometer, a radio direction finder, a gyrocompass, a fluxgate compass, or another device configured to detect the heading, inclination, and/or direction of water truck 120. Sensor system 146 may further include a steering sensor (not shown) configured to sense or otherwise determine a steering angle or direction of water truck 120. Sensor system 146 may further include a speed sensor configured to sense or detect a ground speed or travel speed of mobile machine worksite 102.

The sensor system 146 may also include a tank sensor 129 configured to sense a level of liquid within tank 122 and to provide a tank reading from which a volume or quantity of the liquid within the truck can be assessed. In some examples, tank sensor 129 is a pressure sensor positioned within and near front 121 of tank 122 (i.e., in the direction of forward travel for water truck 120 or further along the X-axis within tank 122 in FIG. 1). As a result, in those examples, when water truck 120 is on an incline with front 121 higher along the Z-axis than rear 123, tank sensor 129 may tend to provide a tank reading lower than a true level of the water in tank 122. Similarly, when water truck 120 is on a decline with front 121 lower along the Z-axis than rear 123, tank sensor 129 may tend to provide a tank reading higher than a true level of the water in tank 122. While tank sensor 129 may provide helpful indications of water quantity for the truck while on a flat surface, movement of water truck 120 causes the surface of liquid within tank 122 to fluctuate, often escalating to sloshing, leading to noisy and unreliable tank readings.

The sensor system 146 may provide information indicative of the values of the various sensed parameters to a communication system 148 for communication to systems apart from water truck 120. The communication system 148 includes any components enabling water truck 120 to communicate wirelessly with other systems via a network 160. To do so, communication system 148 may include one or more modulators, demodulators, multiplexers, demultiplexers, network communication devices, wireless devices, antennas, modems, or any other devices configured to support two-way communication. In addition, communication system 148 may communicate using satellite, cellular, infrared, radio, or other types of wireless communication signals. In some examples, communication system 148 provides information through two-way communication at a periodic rate. While faster or slower rates of transfer are possible based on the conditions of the implementation, system 100 contemplates an environment in which water truck 120 has access to only a low-bandwidth channel for communicating. Additionally, water truck 120 often operates in conditions where wireless connections may be incomplete or unreliable, with water truck 120 operating for stretches of time without communication system 148 being able to communicate wirelessly through network 160. Accordingly, communication system 148 may include timestamps with data transferred to network 160 to indicate when the data had been collected by control system 140.

As illustrated in FIG. 1, system 100 may further include a computing system 162 communicatively coupled to water truck 120 via network 160. The computing system 162 may be any type of computing equipment having a processor 166 (FIG. 2) or a plurality of processors and memory 168 (FIG. 2) storing instructions to be executed by processor 166. The computing equipment may include multiprocessor systems, microprocessor-based electronics, minicomputers, mainframe computers, handheld computers, and the like. Similarly, computing system 162 may be a service provider network configured within a distributed computing environment. Despite the physical arrangement, computing system 162 may receive results from sensor system 146 regarding the status and operation of water truck 120 during a watering mission within worksite 102 as provided by communication system 148. These results may indicate the position, heading, and slope of water truck 120 within worksite 102 at a point in time, along with the status of activities for spray heads 124, cannon 126, dump bar 128, and tank sensor 129, for example. As discussed in more detail below, computing system 162 may use the values of these sensed parameters, for example, to virtually reconstruct, assess, provide feedback, or control operation of water truck 120 during the same or similar watering mission in the future. As part of these steps, computing system 162 may communicate information regarding the operation of water truck 120 back to control system 140 or to a reporting device 164, either directly or through network 160. Thus, at least computing system 162 may support communication via any suitable wired or wireless general data networks, telecommunications/telephony networks, storage area networks, or any other suitable type of network and/or protocol. The reporting device 164 may be a monitor, a printer, projector, or other apparatus configured to present information received from water truck 120 for consideration by personnel in evaluating and possibly modifying operation of water truck 120 within worksite 102 currently or in the future.

Figure 2:
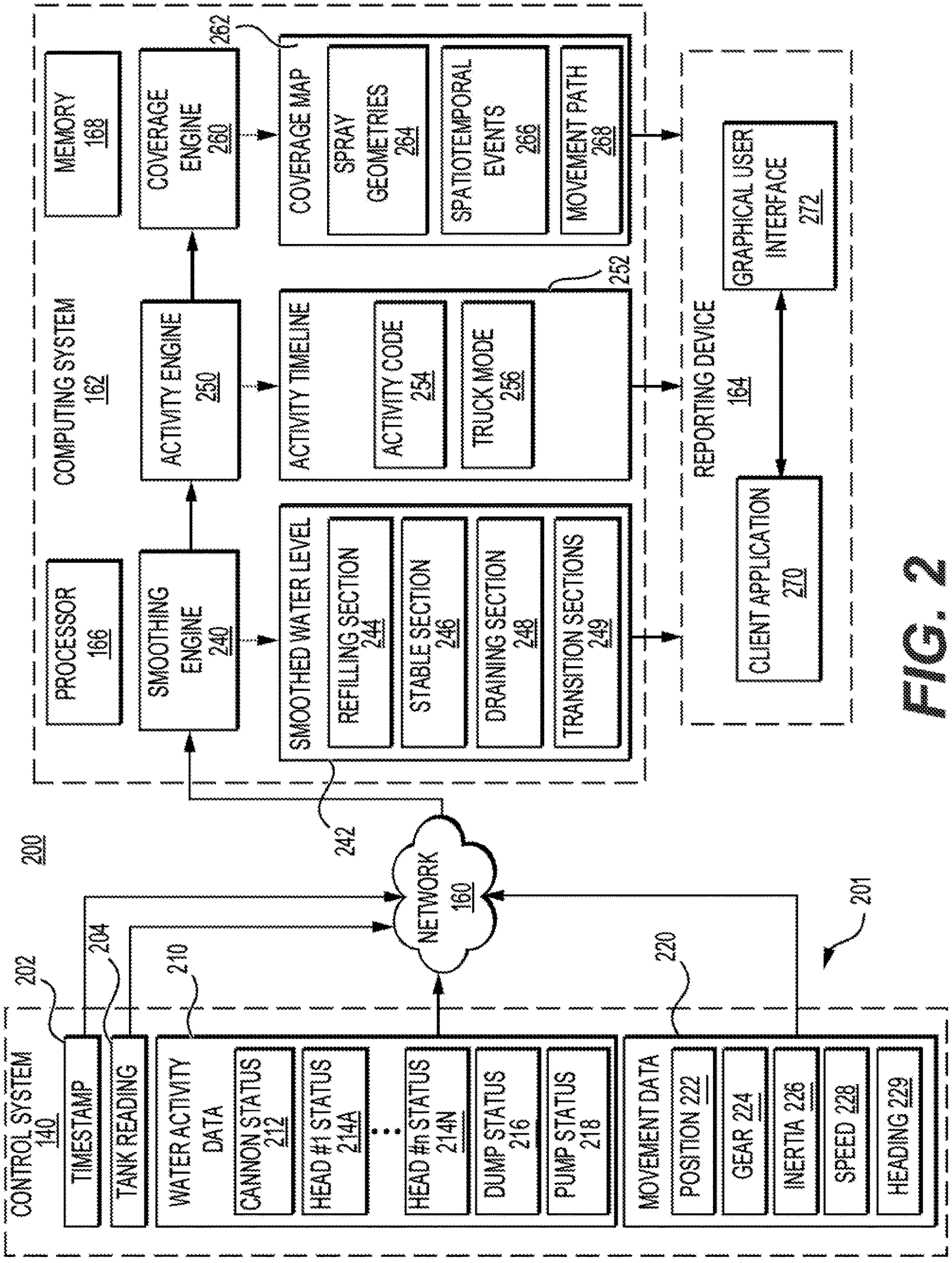
FIG. 2 is a functional block diagram of a portion of the system in FIG. 1 in accordance with an example of the present disclosure.

While FIG. 1 provides an overview of system 100, FIG. 2 depicts a functional block diagram 200 of the data communicated from control system 140 to computing system 162 for digitized reconstruction of the operation of water truck 120 during a watering mission. According to the principles of the present disclosure, data communicated from control system 140 to computing system 162 may be analyzed, in light of potentially infrequent data collection and sporadic or discontinuous data communication, by several modules or engines within processor 166 or memory 168 of computing system 162 to reconstruct a timeline and a mapping of the status and activities for water truck 120. A module or engine in this context refers to hardware, software, or combinations of hardware and software configured to store and execute computer-readable instructions for a particular task. Thus, an engine within computing system 162 may be assigned to a certain processor 166 and memory 168, to instructions within memory alone, or to dedicated hardware implementations for carrying out the applicable tasks.

Referring to FIG. 2, the left-side block depicts data 201 collected by control system 140 and communicated to network 160 by communication system 148. As exemplified, the communicated data 201 may include a set of information repeatedly sampled or collected from the water truck and identified by a unique timestamp 202. Data 201 may be collected within the water truck at any rate appropriate for the implementation. Slower rates of collection will result in lower fidelity for the data, but will require less activity by control system 140. Faster rates of collection will result in higher fidelity for the data, but will require more capacity for managing and/or storing the larger amount of data. In many situations, collecting data slower than once every 10 seconds (i.e., at a frequency less than 0.1 Hz) may lead to poor fidelity for the information. As a result, in some options, the information may be collected between about once every ten seconds and once every 1/10 of a second or faster (i.e., between at a rate between about 0.1 Hz and 10 Hz). In one example, data 201 is collected about once a second (i.e., at a rate of about 1 Hz). Data 201 may be transmitted to network 160 at any rate. As worksite 102 often has poor communication links, control system 140 may send data 201 sporadically or in batches. Accordingly, computing system 162 may evaluate data 201 near to real time or in batches at a time much later than its collection based on the associated timestamps.

Turning to examples of data 201, together with timestamp 202, a tank reading 204 within data 201 identifies a value representing the sensed level of water within tank 122. As mentioned above, due at least to the nature of tank sensors and to the disturbances in the water surface as the truck moves, tank reading 204 may be a gross approximation and a snapshot of noise from tank sensor 129. In some examples, tank reading 204 is a raw water-level reading as a percentage of the capacity of tank 122. The collected data 201 may further include water-activity data 210 representative of the state of each of the water-dispensing elements on the truck. A cannon status 212, for instance, may be a binary flag (logical OFF/ON), indicating whether cannon 126 is operating at the snapshot of timestamp 202. Similarly, data bits corresponding to a head #1 status 214A through head #n status 214N may indicate the OFF/ON state of each of the spray heads 124 on the truck at the respective timestamp 202. The dump status 216 likewise may indicate in digital form the state of dump bar 128 at the timestamp 202. Finally, in some examples, a pump status 218 indicates a state of a pump within water truck 120 that extracts water from tank 122. The pump (not shown) is generally responsible for drawing water from the tank for delivery within worksite 102 and may indicate that water is in use and being dispensed from the truck through one or more of the water-dispensing elements.

As represented by FIG. 2, data 201 from control system 140 may also include movement data 220 generally indicative of a position and motion of water truck 120 at the timestamp 202. Using information from navigation system 144 and/or sensor system 146, control system 140 provides data indicative of position 222 for the water truck. For instance, position 222 may include an X position, a Y position, and a Z position as values of a geometric arrangement for water truck 120 at timestamp 202 relative to a reference location as fed, for example, from an onboard GPS sensor as part of navigation system 144 and/or sensor system 146. Movement data 220 may also include a signal indicating a gear 224 for the water truck, e.g., whether the truck is in forward or reverse (or another setting) at each timestamp 202. As shown in FIG. 2, control system 140 may also provide data indicative of inertia 226 for the water truck, such as a change in velocity in a unit of time detected by an onboard accelerometer or a change in angular motion in a unit of time detected by an onboard gyroscope, each within sensory system 146. Similarly, in some examples, speed 228 provides a value for the reported velocity of water truck 120 at the timestamp 202, and heading 229 provides data representing the direction of water truck 120. Heading 229 may indicate a direction of movement for water truck 120 over time or a direction in which water truck 120 is facing, among other possibilities.

While more or less content is possible for data 201, it is contemplated water truck 120 provides a limited set of information collected at a relatively slow rate (e.g., about 1 Hz or at least about 0.1 Hz) to computing system 162 in an environment that may have sporadic or interrupted connection with network 160. From this limited set of snapshots for the status within water truck 120, computing system 162 may then employ one or more computing engines or modules to virtually reconstruct the activity of water truck 120 during its watering mission consistent with a manner described below.

Figure 3:
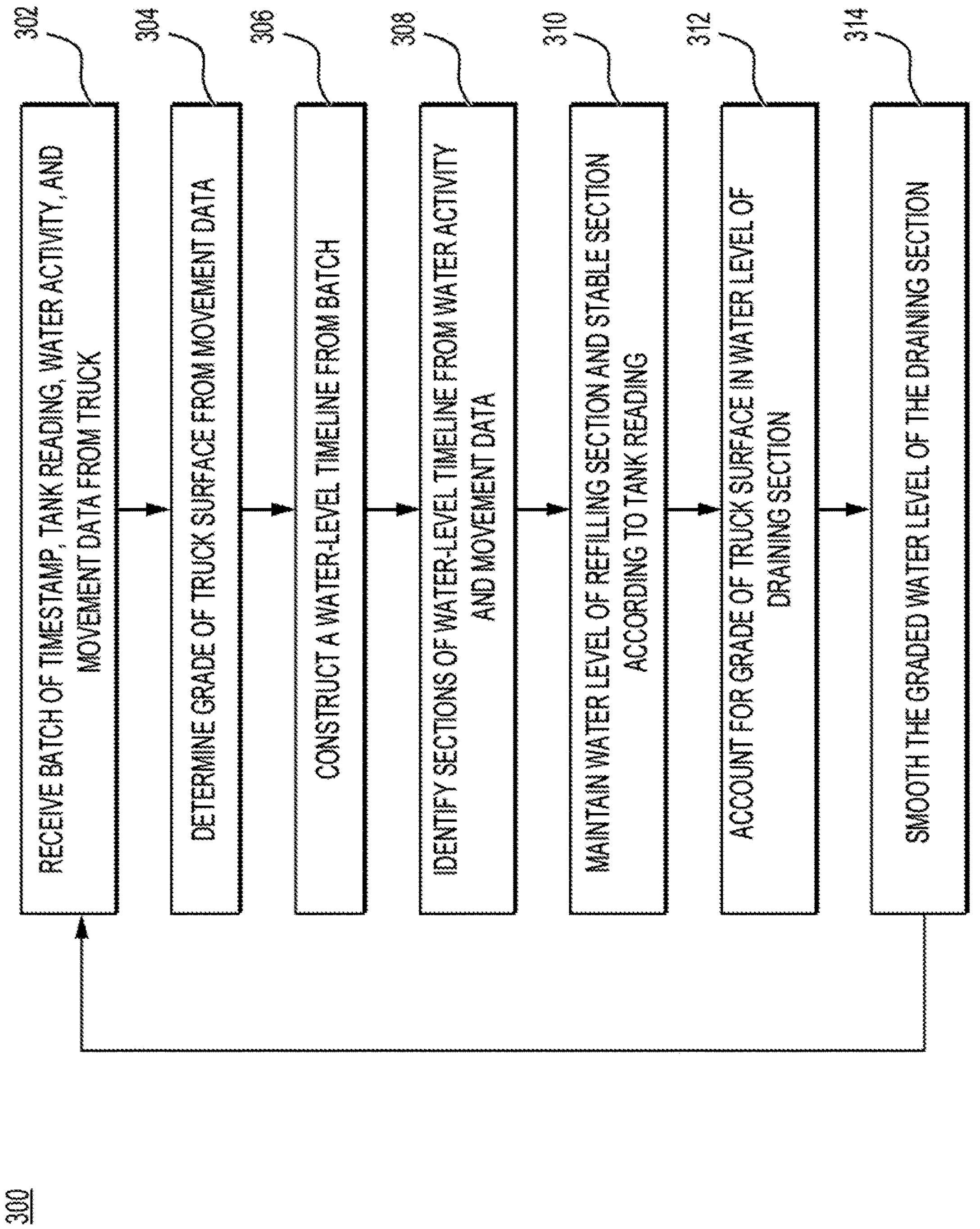
FIG. 3 is a flowchart depicting a method of virtually reconstructing a smoothed water-level timeline in accordance with an example of the present disclosure.

FIG. 2 illustrates that a smoothing engine 240 within computing system 162 is configured to decipher data 201 and generate a smoothed water level 242 indicative of an amount of water within tank 122 during a period of the watering mission for water truck 120. FIG. 3 is a flowchart of a representative method 300 executed by smoothing engine 240 of computing system 162 for constructing the smoothed water level 242 of FIG. 2. This method 300 is illustrated as a logical flow graph, operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations may be combined in any order and/or in parallel to implement the process.

In FIG. 3, in the example method 300, step 302 includes receiving a batch of data containing timestamp, tank reading, water activity, and movement data from the truck. As shown in the example of FIG. 2, control system 140 of water truck 120 provides data 201 to computing system 162 via network 160. The water truck 120 may include and often is limited to, for example, timestamp 202, tank reading 204, water-activity data 210, and movement data 220. This data may be captured by control system 140 as discrete snapshots of a status of water truck 120, each associated with a respective timestamp 202, over a period, such as every second, to form a batch of data. Following receipt of a batch of the data, smoothing engine 240 may process the information to evaluate the conditions of water truck 120, such as, at step 304, a grade or slope of the truck surface. The water truck 120 may be on a flat surface, an inclined surface, or a declined surface, which may be derived from movement data 220, including a Z position within position 222. The grade of the truck surface may have an impact on tank reading 204 as the slope of water truck 120 will cause a change to the surface of the water in tank 122.

Figure 4:
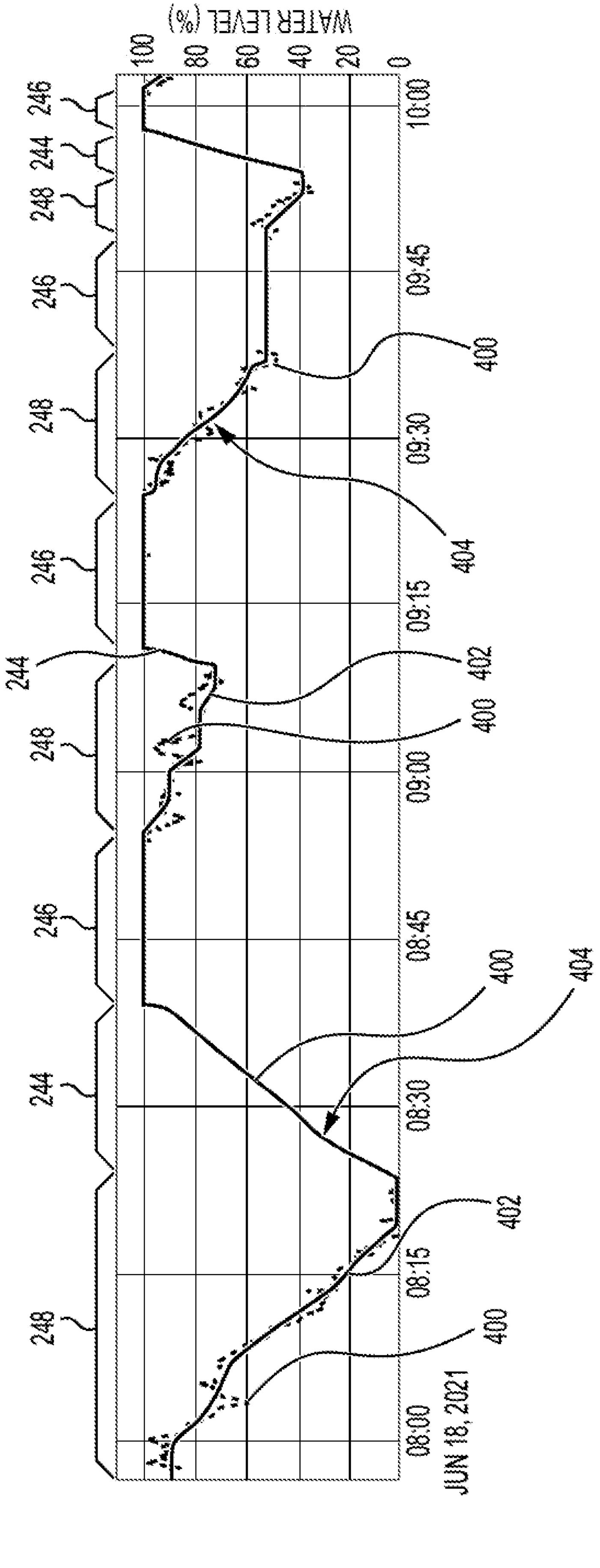
FIG. 4 is a graph depicting an initial water-level timeline and a smoothed water-level timeline in accordance with an example of the present disclosure.

Following collection and initial analysis of a batch of data, method 300 at step 306 constructs a water-level timeline from data 201. Smoothing engine 240 first evaluates tank reading 204 over time within data 201 as an initial water-level timeline. FIG. 4 is a graph illustrating, in part, an initial water-level timeline 400. The horizontal axis in FIG. 4 is time (roughly 2 hours in duration), while the horizonal axis is water level as a percentage of a full tank. Being inherently noisy, tank reading 204 and the resulting initial water-level timeline 400 typically will have sharp changes in surface level and overall instability, such that it provides only a starting point for accurately representing the water usage by water truck 120.

In a step 308, in some examples, smoothing engine 240 in method 300 will then decipher data 201 to identify sections of the initial water-level timeline. This identification of sections may occur in several ways. For instance, evaluating water-activity data 210 and movement data 220, smoothing engine 240 may estimate when water truck 120 was draining water, was being refilled with water, or was in a stable or steady state. In some examples, smoothing engine 240 may conclude from an indication by data 201 that speed 228 was zero, that water truck 120 was stopped at a particular timestamp 202. If water-activity data 210 at that time, and at its surrounding timestamps, also indicates that no water dispensing was occurring, i.e., cannon status 212, the spray heads 214, dump status 216, and pump status 218 are all OFF, then smoothing engine 240 may conclude that water truck 120 is stopped and at a steady state. If this condition persists for a period, such as for more than 10-20 seconds to allow for settling after the truck has come to a stop, smoothing engine 240 may conclude that the water level within tank 122 has become calm and stable. Accordingly, smoothing engine 240 may identify a corresponding section within the initial water-level timeline as a stable section 246, as shown in FIG. 4.

Further within step 308, in some examples, smoothing engine 240 may conclude from an indication that speed 228 was zero and that tank reading 204 is increasing for a period, such as for 10-20 seconds, that tank 122 is being refilled with water. In this condition, although the water level is not constant, its increase tends to follow a substantially linear path. Accordingly, smoothing engine 240 may continue reconstructing the history of water flow from tank 122 by flagging a corresponding portion within initial water-level timeline 400 as a refilling section 244, as shown for several sections in FIG. 4.

After identifying portions of data 201 as a draining section 248 and a refilling section 244, in some examples, smoothing engine 240 may also flag shoulder regions about a stable section 246 as transition sections 249 to further refine and categorize the water-level timeline. Because stable section 246 is a section of high water stability, the periods leading into and out of a stable section 246 timewise also represent periods of relative stability for the water level. As a result, in some configurations, smoothing engine 240 assigns or flags the portions of the initial water-level timeline between stable section 246 and refilling section 244 and between stable section 246 and draining section 248, respectively, as transition sections 249 as part of step 308. The transition sections 249 extend the stable section 246 backwards and forwards in time from a refilling section 244 to a draining section 248, covering when draining has either stopped or started and may be treated within initial water-level timeline 400 as a stable section 246.

At step 310, smoothing engine 240 in method 300 in some examples determines that refilling section 244 and stable section 246 (including transition sections 249) represent periods of reasonable stability for the level of water in tank 122, as a result, smoothing engine 240 can maintain the water level of refilling section 244 and water level of stable section 246 according to the tank reading 204 during those sections. In other words, the system may conclude that refilling section 244 and stable section 246 are sufficiently reliable that those portions of initial water-level timeline 400 should remain unchanged. On the other hand, the level of initial water-level timeline 400 between those sections and particularly between stable sections, namely, when water is being dispensed as water truck 120 moves, are sufficiently noisy as to warrant smoothing or filtering methods to represent the water level more accurately. Those sections, where the tank reading 204 is decreasing over time and the pump status 218 is ON or water-activity data 210 otherwise indicates spraying activity, may be flagged as a draining section 248.

To help generate a smoother water level signal for draining section 248, smoothing engine 240 may in step 312 account for the grade of the truck surface, which was determined in step 304, in the tank reading 204. If water truck 120 travels up an incline (i.e., a positive grade for the truck), water will flow to the back of tank 122 away from tank sensor 129, leading to a lower than true value for tank reading 204. Therefore, when smoothing engine 240 deciphers this grade during a draining section 248, it will in step 312 add to tank reading 204 an amount representative of the positive grade to compensate for the tilt. Conversely, if water truck 120 travels down a decline (i.e., a negative grade for the truck), water will flow to the front of tank 122 toward tank sensor 129, leading to a higher than true value for tank reading 204. Therefore, in step 312, when smoothing engine 240 computes this grade during a draining section 248, it will subtract from tank reading 204 an amount representative of the negative grade to compensate for the tilt.

To further help smooth a reading of water level for draining section 248, smoothing engine 240 may apply filtering to this section of initial water-level timeline 400 to help remove noise from splashing or sloshing of the water. Specifically, in step 314, smoothing engine 240 may apply a filtering technique to smooth the water level within draining section 248 compensated for any grade in the truck surface. For instance, smoothing engine 240 may process data representative of draining section 248 with a smoothing filter. In some examples, the smoothing technique may employ a Savitsky-Golay filter as the smoothing filter. A Savitzky-Golay filter is a digital filter that is based on local least-squares fitting of the data by polynomials and can help smooth noisy data without distorting the signal tendency. In some examples, the smoothing filter, such as a large-windowed Savitzky-Golay, may be applied to help remove spikes in the data collected from tank reading 204 collected over a series of data transfers in a batch from water truck 120. A Savitzky-Golay filter is representative of a smoothing filter that may be used to reduce spikes from noise in draining section 248, and other types of filters known to those of ordinary skill in the art may also or alternatively be employed.

Identifying the draining section 248 between stable sections of water level and applying the smoothing filter only to the draining section 248 helps streamline operation of the process. In some examples, the smoothing filter can be applied selectively to only the draining section 248 rather than to all of initial water-level timeline 400, preserving processing activity, memory, and resources within computing system 162 and speeding method 300 for a batch of multiple sets of data 201. Moreover, applying filtering to relatively stable and accurate portions of initial water-level timeline 400 within, for example, stable section 246 may lead to disturbances of an otherwise accurate representation of tank reading 204.

The filtering to smooth the noise may result in a discontinuity or spike at ends of each draining section 248 (i.e., between the draining section 248 and an adjoining stable section 246), so data for the water level at those ends may be replaced with data that results in a smooth transition between the draining section 248 and the stable section 246. FIG. 4 illustrates a representative result from method 300 with smoothed water-level segment 402 being generated within draining section 248 in several instances.

Following the completion of method 300, the method may be repeated indefinitely as additional batches of data 201 arrive from water truck 120 in order to build a continuous representation of the water level in tank 122 over time. Finally, in some examples, smoothing engine 240 can stitch together the segments of initial water-level timeline 400 for refilling section 244 and stable section 246 with smoothed water-level segment 402 for draining section 248 (replacing the segments of initial water-level timeline 400 for draining section 248), resulting in a smoothed water-level timeline 404 as shown by the solid graph line in FIG. 4. The smoothed water-level timeline 404 provides a smoothed and more accurate depiction of water level within tank 122 across a timeline as derived from snapshot status data at sampling or collection rates between 0.1 Hz and 10 Hz, typically at about 1 Hz. This constructed timeline may be used, for example, to inform or control the operations of water truck 120 about water usage for future watering missions, locally within water truck 120 or remotely as discussed below, or to otherwise modify water activities according to the performance revealed.

As depicted in FIG. 2, computing system 162 further includes an activity engine 250 configured to decipher data 201 and generate an activity timeline 252 indicative of activities by water truck 120 across a timeline of the watering mission, such as smoothed water-level segment 402. Activity engine 250 processes data 201 to identify a status of water truck 120 across a timeline than otherwise is evident from the snapshots. The activities may take many forms and definitions based on the implementation and often are useful to clarify the operating conditions in which the watering mission was conducted. In some examples, activities of the truck include relationships of the movement of water truck 120, the amount of water in tank 122, and the status of liquid-dispensing system 141. The movement of water truck 120, i.e., whether the machine is traveling, may be determined from movement data 220, particularly speed 228. The amount of water in tank 122 may be determined from smoothed water level 242 and smoothed water-level segment 402. Whether the truck is dispensing water can be determined from water-activity data 210, particularly pump status 218.

In one option, activity engine 250 interprets and assigns codes to data 201 as combinations of the movement, tank level (where tank is considered empty if its water level is less than 5%), and spray events as follows. These activities and codes are exemplary only; other activities and codes may be selected and mapped to data 201 based on the implementation.

| Activity | Code |
|---|---|
| No activity | 0 |
| Traveling; Not Empty; Water On | 1 |
| Traveling; Not Empty; Water Off | 2 |
| Stopped; Not Empty; Water On | 3 |
| Stopped; Not Empty; Water Off | 4 |
| Traveling; Empty; Water On | 5 |
| Traveling; Empty; Water Off | 6 |
| Stopped; Empty; Water On | 7 |
| Stopped; Empty; Water Off | 8 |
| Refilling | 9 |

From these assignments, activity engine 250 can compile an activity timeline 252 representative of the operating conditions for water truck 120 during its watering mission. Activity timeline 252 may be overlaid on smoothed water-level timeline 404 to provide a more complete indication of the operation of the water truck at various stages of its watering mission. It will be apparent to those of ordinary skill in the art that other operating conditions defined by data 201 may be identified and flagged based on the implementation of water truck 120 and activity engine 250.

In another example, water-activity data 210 may include information regarding the operating status of the liquid-dispensing system 141. The activity engine 250 may then also analyze batches of data 201 and assign codes relating to the operating status of the spraying operation within an activity timeline 252, each representing a truck mode 256. In one option, the following truck modes may be assigned codes by activity engine 250 within the activity timeline 252, with each code indicating that the corresponding mode is active at the respective timestamp 202. These truck modes and codes are representative only; others truck modes and codes may be identified by water truck 120 and used for mapping within activity timeline 252 as available and desired.

| Truck Mode | Code |
|---|---|
| Unknown | 0 |
| Manual | 1 |
| Head Clean | 2 |
| Water Cannon | 3 |
| Tank Fill | 4 |
| Auto Mode | 5 |
| Dump Bar | 6 |
| Hose Reel | 7 |

Following assignment of activity code 254 and/or truck mode 256 to an activity timeline 252, the data may be merged or overlaid with smoothed water-level timeline 404 to provide a fuller understanding and display of the operation and behavior of water truck 120 during the watering mission. For instance, the assignment of each activity code 254 can better reveal how water levels were managed with the truck between filling operations and to conserve water and fuel for the truck. The truck mode 256 can better inform about the operator's control of water truck 120 during the mission, which can be used to improve for the next watering cycle. Specifically, discrete status data such as activity code 254 or truck mode 256 may not be useful to an operator or manager of worksite 102, but activity code 254 or truck mode 256 overlaid together with smoothed water level 242 may provide useful feedback about water truck 120 and the watering mission. For example, the truck mode 256 can reveal the amount of time spent by water truck 120 on any particular action, which may be used to assess efficiency during the watering mission.

Figure 5:
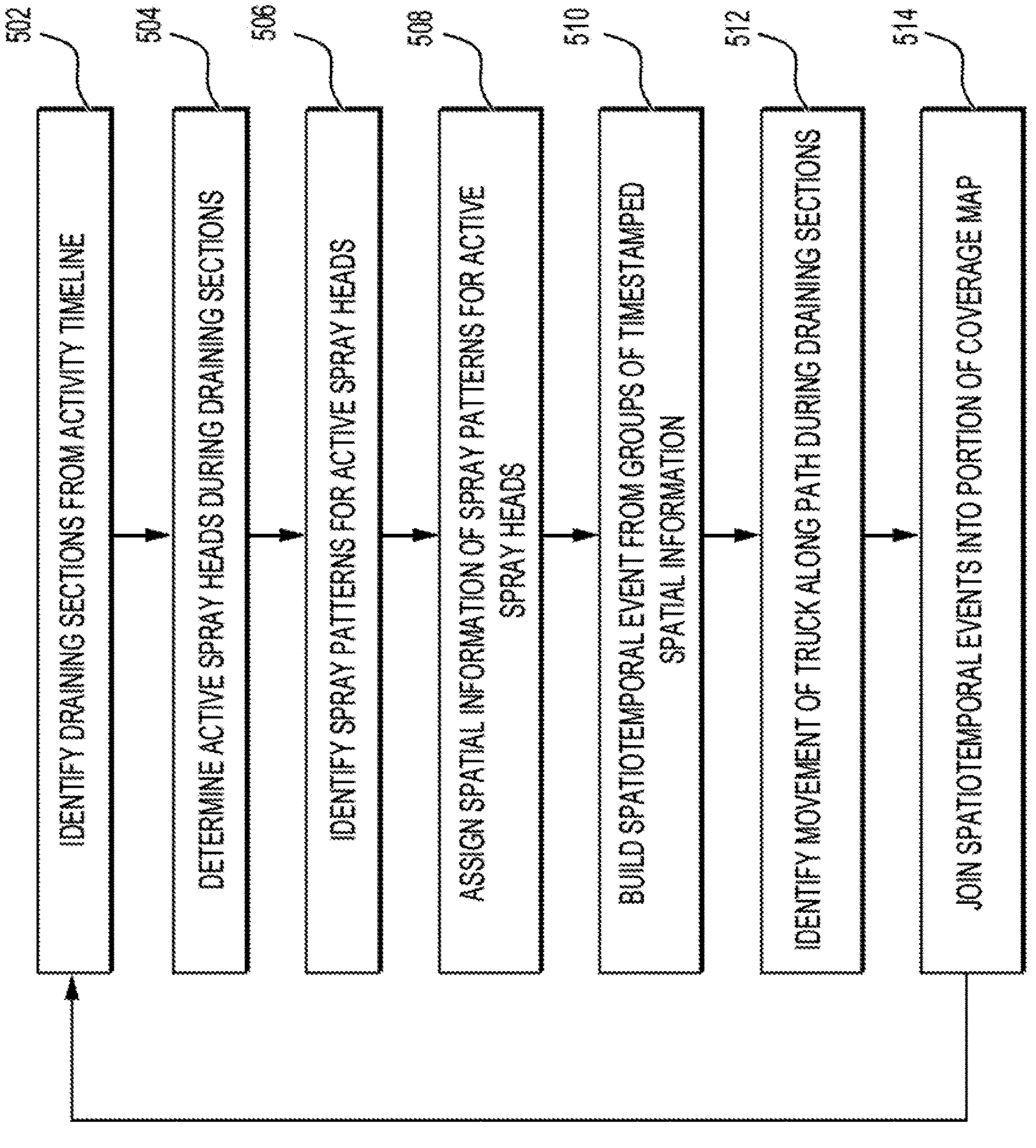
FIG. 5 is a flowchart depicting a method of generating a coverage map of a watering mission in accordance with an example of the present disclosure.
Figure 6:
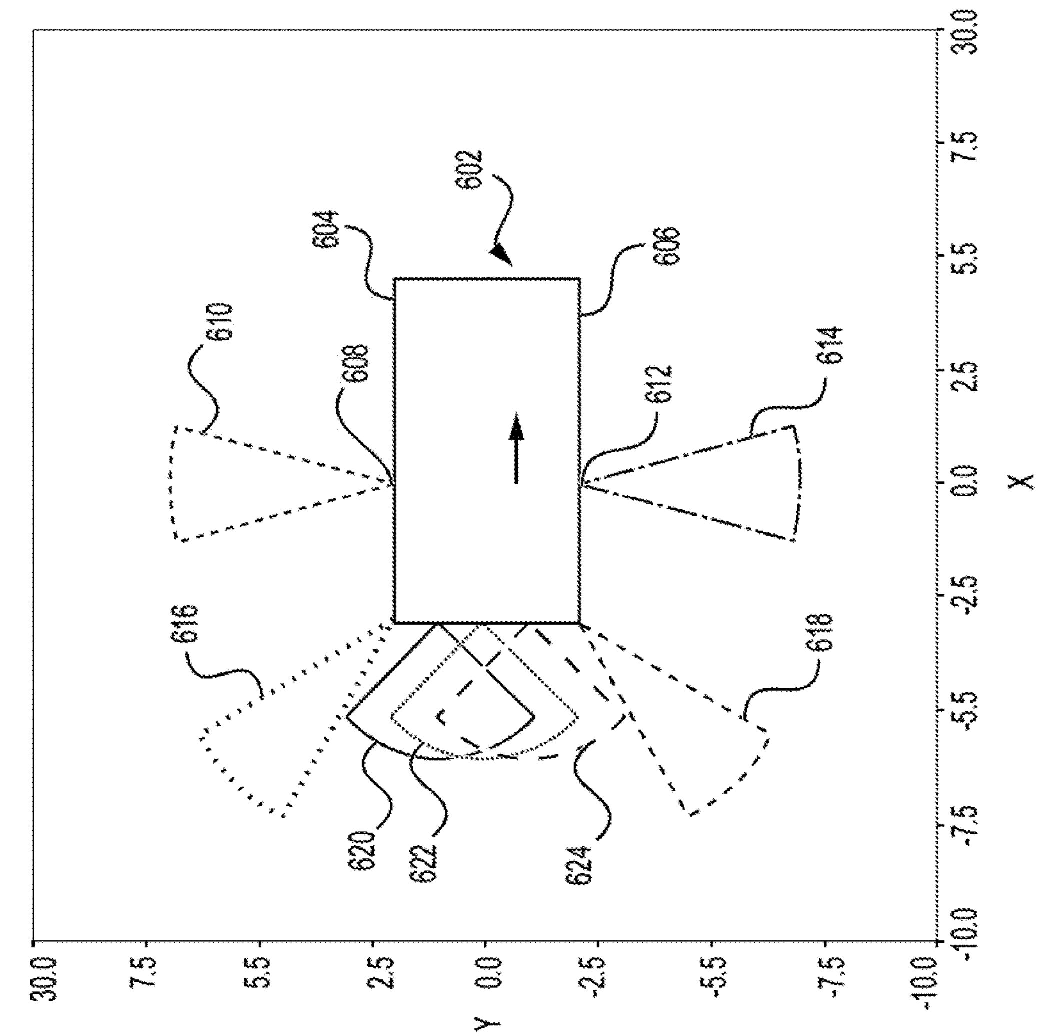
FIG. 6 is a schematic diagram of a water truck with spray patterns in accordance with an example of the present disclosure.
Figure 7:
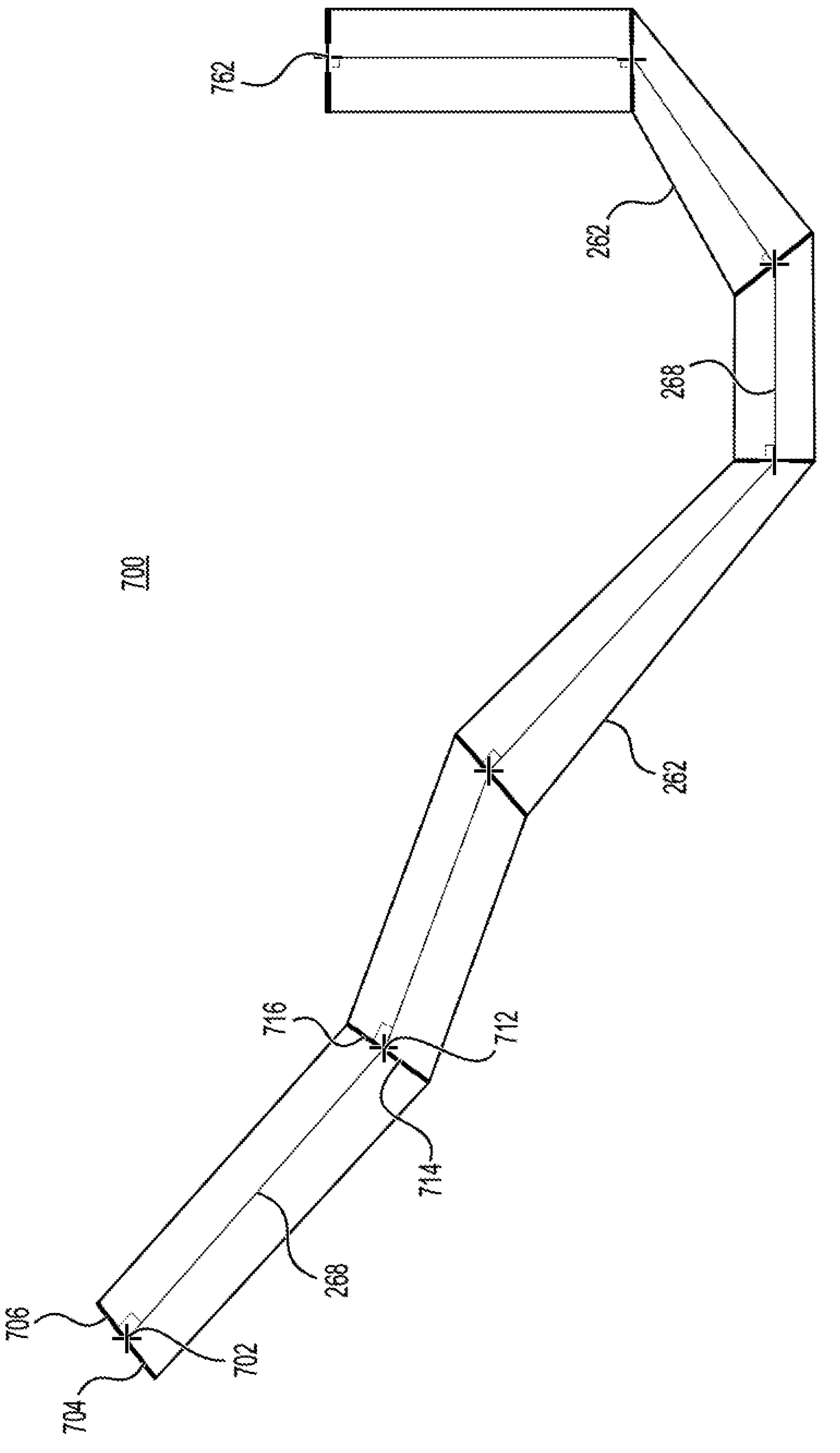
FIG. 7 is a generalized coverage map of a water mission in accordance with an example of the present disclosure.

As shown in FIG. 2, computing system 162 may additionally include a coverage engine 260 configured to decipher data 201 and to graphically reconstruct the coverage of water provided by liquid-dispensing system 141 during the watering mission. While smoothing engine 240 and activity engine 250 are primarily directed to reconstructing and populating a timeline from sporadic or intermittent data received from water truck 120, coverage engine 260 may expand the information gleaned from smoothing engine 240 and activity engine 250 to include spatial information relating to the spraying of water during movement of water truck 120 about worksite 102. In general, coverage engine 260 in some examples begins with results provided by smoothing engine 240 and activity engine 250 regarding the timing of draining or spraying activities and then assigns, or decorates, the timeline during draining section 248 of smoothed water-level timeline 404 with spatial information specific to the spray heads active during that period and along the geographic path followed by the truck during that period. FIGS. 5-7 provide further illustration relating to the operation of coverage engine 260.

FIG. 5 is a flowchart of a representative method 500 executed by coverage engine 260 of computing system 162 to graphically reconstruct the coverage of water provided by liquid-dispensing system 141 during the watering mission. This method 500 is illustrated as a logical flow graph, operation of which represents a sequence of operations that can be implemented in hardware, software, or a combination thereof. In the context of software, the operations represent computer-executable instructions stored on one or more computer-readable storage media that, when executed by one or more processors, perform the recited operations.

Generally, computer-executable instructions include routines, programs, objects, components, data structures, and the like that perform particular functions or implement particular data types. The order in which the operations are described is not intended to be construed as a limitation, and any number of the described operations may be combined in any order and/or in parallel to implement the process.

According to FIG. 5, at step 502, the draining sections are identified from the activity timeline. As shown in FIG. 2 and discussed above, smoothing engine 240 is configured to identify draining section 248 as a portion of smoothed water-level timeline 404 in which water truck 120 is moving and dispensing water, as indicated by an active state across consecutive time periods for pump status 218 and one or more of the spray heads. Identifying draining section 248 within 502 by coverage engine 260 before attempting to apply spatial spray patterns to a timeline and to build a coverage map can help computing system 162 conserve processing and memory resources by acting on only a subset of the mission and timeline for water truck 120 that is related to the delivery of water to worksite 102.

In a second step 504 of method 500, active spray heads are identified during the draining sections. Generally, water trucks may be arranged with different configurations of spray heads. In some situations, a truck may have a so-called three-spray configuration, which has a spray head on each side of the truck and three spray heads along the rear of the truck. In other examples, the truck may have a so-called four-spray configuration with the same spray heads on the sides and four spray heads along the rear of the truck. Other configurations are also possible and known to those of ordinary skill in the field. Accordingly, because water-activity data 210 identifies the binary state of each of the spray heads on water truck 120, activity engine 250 will access water-activity data 210 to determine which of the spray heads on water truck 120 are active for a particular tank reading 204 within a draining section 248.

In step 506, spray patterns for the active spray heads within the water truck are identified. In addition to a water truck having variable configurations of spray heads, those spray heads may have different spray patterns or geometries. For instance, some spray heads may project water in a conical arrangement, while other spray heads may provide water in more of a semicircular pattern. FIG. 6 depicts a schematic top view 600 of one example of various spray patterns for a five-spray configuration for one representative water truck 602. The water truck 602 is depicted in the top view traveling from the left to the right on the page and having a left side 604 and right side 606. As shown in FIG. 6, water truck 602 has a left spray head 608 at left side 604 that projects a left spray pattern 610 outwardly from the truck in a conical pattern similar to the geometry of an isosceles triangle. Similarly, water truck 602 has a right spray head 612 at right side 606 that projects a right spray pattern 614 outwardly from the truck in a conical pattern also similar to the geometry of an isosceles triangle.

The water truck 602 in FIG. 6 also has five spray heads (not shown) along its rear side. As illustrated, the heads at the rear corners of the truck (left-rear pattern 616 and right-rear pattern 618) generate spray patterns having a geometry generally the same as left spray pattern 610 and right spray pattern 614, i.e., a conical shape resembling an isosceles triangle. In contrast, the spray patterns emanating directly from the rear of water truck 602 have a semispherical shape resembling more of an equilateral triangle. These geometries, depicted by rear-left pattern 620, rear-center pattern 622, and rear-right pattern 624, overlap each other as they trail behind moving water truck 602.

In some examples, these spray patterns and other potential geometries for spray ejecting from heads on water truck 120 are stored in memory in a configuration file of spray geometries 264. During execution of method 500, coverage engine 260 accesses the configuration file and the relevant data identifying the spray geometry or pattern for each of the heads identified as being active during draining section 248, according to step 506. Therefore, if coverage engine 260 identifies from data 201 that right spray head 612 is active during draining section 248, for example, coverage engine 260 will access the related right spray pattern 614 from spray geometries 264. Alternative to the spray geometries 264 being stored in memory, the spray geometries 264 may be retrieved by coverage engine 260 during execution of method 500.

In step 508, spatial information of the spray geometries are assigned for the active spray heads identified in step 506. In some examples, for each tank reading 204 and associated data 201 within a draining section 248, coverage engine 260 will assign or otherwise associate the spatial information from spray geometries 264 with the spray heads indicated as being active. During a draining section 248, different ones of the spray heads may be active or inactive over time. As a result, coverage engine 260 further populates the timeline of activity for water truck 120 during a draining section 248 with spatial information related to a pattern of the spray distribution around the truck at each timestamp 202.

FIG. 5 indicates that in a step 510, multiple ones of the spatial information for spray heads active during a draining section 248 and associated with respective timestamps are grouped together to form a spatiotemporal event (STE) 266. An STE describes both spatial and temporal phenomenon that exist at a certain time (or interval) and location. In this context of watering a worksite 102, an STE describes an area of surface watered by a given water truck in a given time range. Accordingly, a plurality of timestamps across a period of time, for example one minute, may be collected with their corresponding spatial information of geometries for active spray heads and aggregated to form a spatiotemporal event 266. As such, groups of aggregated data for a timeline, such as smoothed water-level timeline 404 and activity timeline 252, extend beyond a discrete timestamp 202, and the groups as STEs essentially becomes multi-dimensional rather than one-dimensional. The size of a spatiotemporal events 266 can be selected to provide a desired level of granularity to the data representing coverage map 262. Smaller durations for spatiotemporal events 266 may provide more detail and precision to the mapping, but will also generate larger amounts of data and require greater amounts of storage or memory.

To expand the collected data to virtually reconstruct water coverage by water truck 120, the spray patterns of the spray heads active during a draining section 248 also should be, in some examples, associated with a movement path 268 of water truck 120 during the watering mission. Thus, as indicated in step 512 of FIG. 5, the method 500 includes identifying movement path of the truck during the draining, or spraying, sections. Accordingly, coverage engine 260 may refer to movement data 220 across the draining section 248 to decipher the orientation and direction of the truck as it moves, based on, for example, elements such as position 222, gear 224, and heading 229.

Finally, for method 500, in step 514, the spatiotemporal events collected across a draining section 248 are joined together to form a portion of a coverage map 262. In some examples, the joining of the STEs can be presented graphically in a manner to reflect at least a two-dimensional representation of the watering coverage during the mission of water truck 120. Additionally, following from step 512, the joined spatiotemporal events along the timeline may be tied to movement path 268 to provide a more precise representation of how water was dispersed within worksite 102 as a coverage map 262.

FIG. 7 illustrates one example of a coverage map 700 consistent with the principles of the present disclosure. For this example, the model assumes that the water truck has two spray heads operating, one on opposite sides of the vehicle such as left spray head 608 and right spray head 612. While these spray heads may provide a conical spray pattern such as left spray pattern 610 and right spray pattern 614, the model depicts these patterns as straight lines emanating from the location of the truck. Thus, at a first position 702 within draining section 248, the spray pattern may be depicted by right spray 704 and left spray 706. The data at first position 702 will be associated with a unique timestamp 202. At second position 712 within draining section 248, the spray pattern associated with the truck for the activated heads may be depicted by right spray 714 and left spray 716. This representation may be repeated throughout draining section 248 until a final position 762 at the end of draining section 248 as shown in FIG. 7. Consistent with step 510 and 514 discussed above, these discrete watering events may be expanded along movement path 268 for a set time length to form spatiotemporal events, and the spatiotemporal events may then be joined together. Referring to FIG. 7, the joining of the STEs results in a coverage map 262 that may be depicted as a polygon representing the area within which the surface of worksite 102 was watered by water truck 120. For simplicity, FIG. 7 illustrates an example with spray heads on only the sides of the truck. More complicated representations as coverage map 262 may be generated using more and different spray patterns, such as the geometries shown in FIG. 6.

Figure 8:
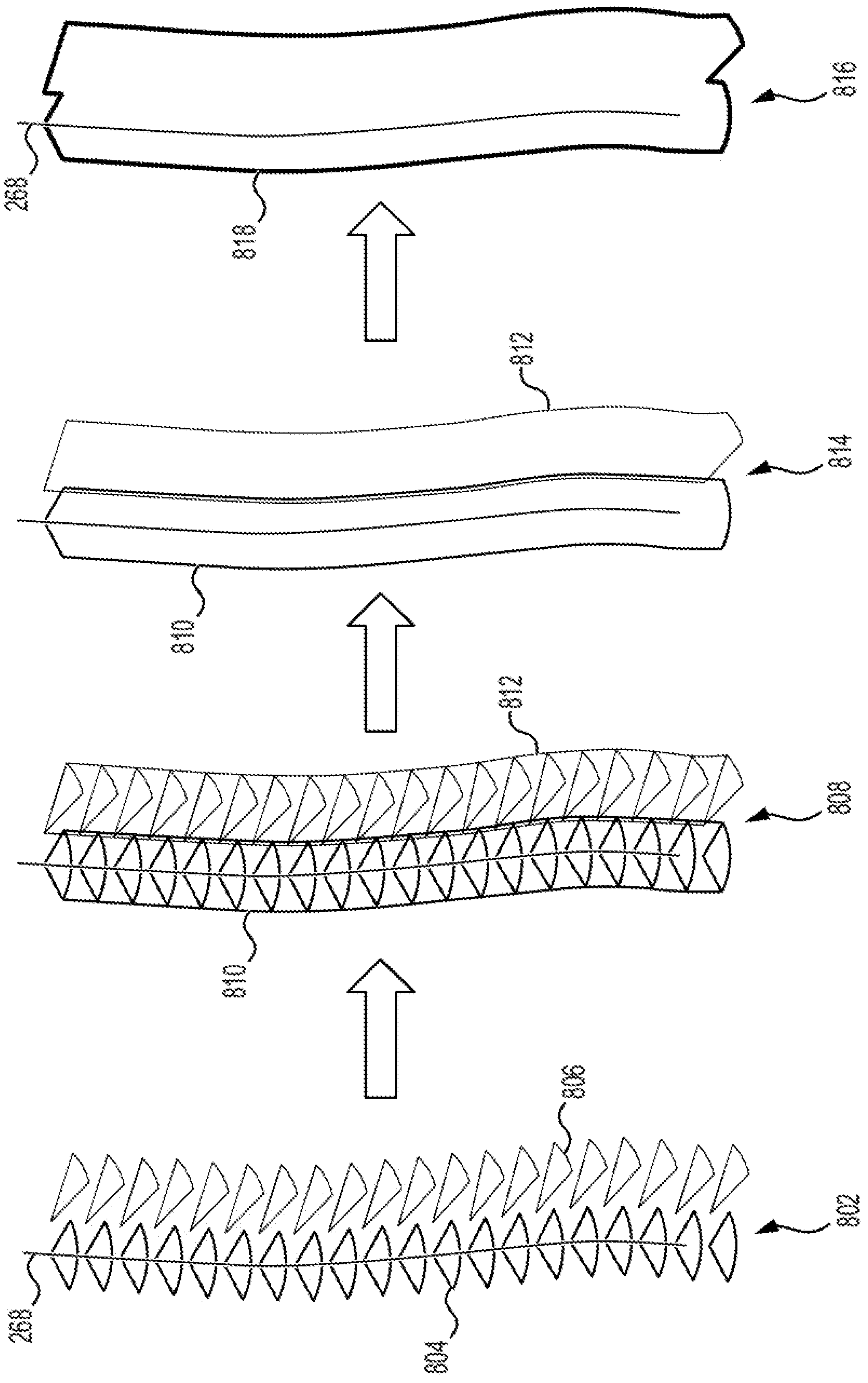
FIG. 8 is another generalized coverage map of a water mission in accordance with an example of the present disclosure.

FIG. 8 illustrates another example of a coverage map 262 developed following the principles of the present disclosure. In this example, as shown in initial stage 802, water truck 120 follows movement path 268 while distributing water at its rear side with a semicircular spray pattern 804 and at its right side with a conical spray pattern 806. For illustration, these spray patterns may be viewed as corresponding to rear-center pattern 622 and right-rear pattern 618, respectively, in the example of FIG. 6. Each pattern 804 and 806 in FIG. 8 represents a geometric pattern of water sprayed from the water truck at a different timestamp 202. At second stage 808, the discrete geometric patterns 804 and 806 for each timestamp may be aggregated to form one or more spatiotemporal events. For instance, geometric patterns for semicircular spray pattern 804 at multiple timestamps 202 may be aggregated to form a first spatiotemporal event 810. Similarly, for geometric patterns for conical spray pattern 806, the geometric patterns at multiple timestamps may be aggregated to form a second spatiotemporal event 812. At third stage 814, the spatiotemporal events 810 and 812 can become the continuous representation of water distribution from the respective spray heads that cause patterns 804 and 806 over a period of time. Finally, at fourth stage 816, spatiotemporal events 810 and 812 may be accumulated or merged to form a polygon 818 graphically representing the distribution of water from the truck along movement path 268 over the surface of worksite 102 for the selected timestamps. Additional polygons may be similarly generated and stitched together along movement path 268. Compared with FIG. 7, the process depicted in FIG. 8 provides a more granular representation of the spray distribution, showing higher precision for potential changes in the width of the watered area at sides of the water truck and for curvature to the path of the water truck.

As indicated in FIG. 2, computing system 162 may communicate smoothed water level 242, activity timeline 252, and/or coverage map 262 to reporting device 164. In some examples, reporting device 164 is part of, or a subset of, computing system 162. In other examples, computing system 162 functions as a service provider network within the "cloud," and reporting device 164 is physically and operationally distinct from computing system 162. As such, reporting device 164 may be located at a different location from computing system 162 and is accessible through a network connection, such as network 160. Reporting device 164 may include a client application 270 for processing data received from computing system 162 for presentation on a graphical user interface 272. In some examples, the graphical user interface 272, which may be a computer monitor, overhead display, tablet, or any other product for presenting information to a recipient, provides the results of smoothed water level 242, activity timeline 252, and/or coverage map 262 for the recipient to analyze the performance of water truck 120 according to its water levels and water coverage during a mission for improvement, refinement, or confirmation with respect to a future watering mission within worksite 102. Alternatively or additionally, computing system 162 may communicate smoothed water level 242, activity timeline 252, and/or coverage map 262 back to worksite 102 via network 160 for presentation to an operator or for control system 140 to process and provide instruction, control, or other feedback to the operator for a future watering mission within worksite 102.

The computing system 162 may also retain one or more of smoothed water level 242, activity timeline 252, and coverage map 262 in memory 168 for future evaluation by personnel or control of water truck 120. Therefore, system 100 provides a replay capability for historical water treatment or coverage of worksite 102 during a watering mission and watering activity by water truck 120 at any desired time or span of time, all of which can be accessed when needed.

Those of ordinary skill in the field will appreciate that the principles of this disclosure are not limited to the specific examples discussed or illustrated in the figures. For example, while a water truck dispensing water around a worksite has been disclosed, the liquid-dispensing vehicle of the present disclosure are applicable to any variety of vehicles and environments for delivering fluids. Also, it will be appreciated that although advantages exist in developing a smoothed water-level timeline before an activity timeline or a coverage map, the sequence of reconstructing timelines and activities may occur in any order convenient for the implementation. Moreover, while the present disclosure addresses transmitting data from a water truck to a remote computing system, a computing system within the worksite or otherwise nearby to the water truck could also benefit from the examples and techniques disclosed and claimed.

INDUSTRIAL APPLICABILITY

The present disclosure provides systems and methods for virtually reconstructing a mission of a liquid-dispensing vehicle. In some examples, a water truck delivers water from a tank through spray heads to combat dust and other airborne particulates at a worksite during the mission. Operating in an environment with potentially low-bandwidth and intermittent communications, the vehicle periodically transmits timestamped data relating to a tank level, truck movement, and a binary status of the spray heads to an external computing system. The computing system digitally reconstructs the operation of the truck and treatment of the worksite by building timelines and coverage maps from the timestamped data following steps to minimize drain on computing resources such as memory and processing cycles. The timelines and coverage map provide a representation of the mission activity, which may be used for assessing the efficiency of the water truck and the treatment of the worksite or for controlling the water truck during future operations of the water truck.

As noted above with respect to FIGS. 1-7, an example system for virtually reconstructing a watering mission includes a water truck 120, a computing system 162, and a reporting device 164. The water truck 120 has a tank 122 with a tank sensor 129 and a control system 140 for managing and monitoring operation of the vehicle. In some examples, as the water truck executes a watering mission within a worksite 102, its control system periodically communicates to computing system 162 data containing a timestamp 202, a tank reading 204, water-activity data 210, and movement data 220. The timestamps may be separated by one second or more in some examples, and the communication link with computing system 162 may be sporadic or of low bandwidth within a rugged environment of worksite 102. The computer system may include a smoothing engine 240 that builds an initial water-level timeline 400 and identifies at least one of a refilling section 244, a stable section 246, and a draining section 248. Concluding that the refilling section and the stable section have reliable water readings from tank sensor 129, smoothing engine 240 adjusts and/or filters a water level for draining section 248 to compile an initial water-level timeline 400, preserving memory and processing capacity of computing system 162. The computing system 162 may also include an activity engine 250 for assigning truck activities to a timeline of the mission, such as initial water-level timeline 400, and a coverage engine 260 for generating a coverage map 262. The coverage engine 260 develops spatiotemporal events across a series of timestamps based on spray patterns for respective spray heads deemed active by water-activity data 210 during the timestamps. The spatiotemporal events are accumulated into one or more polygons providing at least a two-dimensional representation of the watering mission along a movement path 268 of the truck.

In the examples of the present disclosure, the timelines and coverage map provide a graphical reconstruction of the watering mission for use by an operator or supervisor of water truck 120 via a reporting device 164. The timelines and coverage map can help identify efficiencies or inefficiencies in the operation of worksite 102 or the treatment of worksite 102 with water. Future missions for worksite 102 can be improved from the timelines and/or coverage map, leading to better water or fuel efficiency and possibly increased safety for personnel within worksite 102. In some examples, the resulting data may be fed back to water truck 120 for processing by control system 140 to alter the behavior of water truck 120 in future missions based on the data. Moreover, the sequence of steps to recreate at least initial water-level timeline 400 and the map, such as coverage map 700, focuses on at least one draining section 248, which conserves computer resources. Accordingly, using limited amounts of largely binary data, collected periodically often at about 1 Hz, and delivered in an environment in which a communication link may be disrupted for periods of time, the system and method of the present disclosure effectively enables virtual reconstruction of the operation of a water truck and the spreading of water about a worksite with minimal drain on computing resources Unless explicitly excluded, the use of the singular to describe a component, structure, or operation does not exclude the use of plural such components, structures, or operations or their equivalents. As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Terms of approximation are meant to include ranges of values that do not change the function or result of the disclosed structure or process. For instance, the term "about" generally refers to a range of numeric values that one of skill in the art would consider equivalent to the recited numeric value or having the same function or result. Similarly, the antecedent "substantially" means largely, but not wholly, the same form, manner or degree, and the particular element will have a range of configurations as a person of ordinary skill in the art would consider as having the same function or result. As an example, "substantially 1 Hz" need not be exactly 1 Hz but may also encompass slight variations of a few degrees based on the context.

While aspects of the present disclosure have been particularly shown and described with reference to the embodiments above, it will be understood by those skilled in the art that various additional embodiments may be contemplated by the modification of the disclosed systems and methods without departing from the spirit and scope of what is disclosed. Such embodiments should be understood to fall within the scope of the present disclosure as determined based upon the claims and any equivalents thereof.

What is claimed is:

1. A system for digitally reconstructing a watering mission, comprising:

a liquid-dispensing vehicle, comprising:

a tank holding a liquid;

dispensing elements configured to dispense the liquid into atmosphere above a worksite external to the vehicle;

a control system configured to coordinate operation of the liquid-dispensing vehicle, the control system comprising:

a navigation system configured to detect a location and movement of the liquid-dispensing vehicle within the worksite, a sensor system configured to sense parameters associated with the liquid-dispensing vehicle, the parameters including a tank reading indicative of a level of the liquid in the tank, a status of the dispensing elements, and a slope of the liquid-dispensing vehicle, and a communication system configured to transmit the parameters with a timestamp from the liquid-dispensing vehicle to a remote location; and a computing system, located at the remote location from the liquid-dispensing vehicle, comprising:

a smoothing engine configured to digitally reconstruct a smoothed water-level timeline from a batch of the parameters having different timestamps, the smoothed water-level timeline including a refilling section, a stable section, and a draining section, the draining section being processed by a smoothing filter;

an activity engine configured to generate an activities timeline for the liquid-dispensing vehicle, the activities timeline comprising at least one of an activity code and a truck mode for a timestamp across the smoothed water-level timeline, a coverage engine configured to determine from the data snapshots spatial information of spraying activity for the water truck during the draining section, and one or more processors configured to receive the batch of the parameters from the communication system and to execute the smoothing engine, the activity engine, and the coverage engine to generate a digitized reconstruction of the watering mission for the liquid-dispensing vehicle, wherein the control system is further configured to control operation of the liquid-dispensing vehicle during subsequent watering activity based, at least in part, on the digitized reconstruction generated by the computing system.

2. The system of claim 1, wherein the truck mode represents the status of the water-dispensing elements on the water truck at a respective timestamp.

3. The system of claim 1, wherein the coverage engine is further configured to:

identify spray geometries for corresponding ones of the dispensing elements indicated within the parameters as being active, assign the spray geometries to the corresponding ones of the dispensing elements for the batch of the parameters, and aggregate the spray geometries across a subset of the batch to form a spatiotemporal event.

4. The system of claim 3, wherein the coverage engine is further configured to:

accumulate the spatiotemporal events along a movement path of the liquid-dispensing vehicle to form a coverage map representative of treatment of the worksite with the liquid.

5. The system of claim 4, wherein the digitized reconstruction of the watering mission includes the coverage map.

6. The system of claim 1, wherein the activity code represents a combination of the movement data, the water level, and the spraying activity at a respective timestamp.

7. A computer-implemented method, comprising:

receiving, by a computing system and from a water truck located remotely from the computing system, data snapshots for parameters of the water truck during a watering mission, each of the data snapshots comprising a timestamp, a tank reading of a water level in a tank of the water truck, water-activity data indicative of a status of water-dispensing elements on the water truck, and movement data indicative of a location and movement of the water truck;

constructing, by the computing system, an initial water-level timeline from the data snapshots based, at least in part, on the timestamp and the tank reading in each of the data snapshots;

identifying, by the computing system, sections of the initial water-level timeline from the water-activity data and the movement data, the sections including a refilling section, a stable section, and a draining section;

maintaining, by the computing system, the tank reading within the refilling section and the tank reading within the stable section, respectively, for the initial water-level timeline;

applying, by the computing system, a smoothing filter to the draining section to produce a smoothed draining section;

generating, by the computing system, a smoothed water-level timeline from the initial water-level timeline;

compiling, by the computing system, an activities timeline for the water truck, the activities timeline comprising at least one of an activity code and a truck mode for a timestamp merged with the smoothed water-level timeline;

determining from the data snapshots, by the computing system, spatial information of spraying activity for the water truck during the draining section;

generating, by the computing system, a digitized reconstruction of the watering mission from the activities timeline and the spatial information of the spraying activity; and controlling the water truck during subsequent watering activity based, at least in part, on the digitized reconstruction generated by the computing system.

8. The computer-implemented method of claim 7, wherein the activity code represents a combination of the movement data, the water level, and the spraying activity at a respective timestamp.

9. The computer-implemented method of claim 7, wherein the truck mode represents the status of the water-dispensing elements on the water truck at a respective timestamp.

10. The computer-implemented method of claim 7, wherein determining spatial information of spraying activity for the water truck comprises:

identifying, by the computing system, spray geometries for the water-dispensing elements indicated by the water-activity data as being active; and assigning, by the computing system, the spray geometries to the corresponding ones of the water-dispensing elements for the data snapshots.

11. The computer-implemented method of claim 10, further comprising aggregating the spray geometries across some of the data snapshots to form a spatiotemporal event.

12. The computer-implemented method of claim 11, further comprising accumulating the spatiotemporal events along a movement path of the water truck to form a coverage map for the watering mission.

13. The computer-implemented method of claim 12, wherein the accumulating the spatiotemporal events comprises forming a polygon representing a cumulative spray pattern from the water truck along the movement path.

14. The computer-implemented method of claim 12, wherein the digitized reconstruction of the watering mission includes the coverage map.

15. A non-transitory computer-readable storage medium having instructions stored thereupon which are executable by one or more processors and which, when executed, cause the one or more processors to:

receive, from a water truck located remotely from the one or more processors, data snapshots for parameters of the water truck during a watering mission, each of the data snapshots comprising a timestamp, a tank reading of a water level in a tank of the water truck, water-activity data indicative of a status of water-dispensing elements on the water truck, and movement data indicative of a location and movement of the water truck;

construct an initial water-level timeline from a batch of the data snapshots based, at least in part, on the timestamp and the tank reading for each of the data snapshots;

identify sections of the initial water-level timeline from the water-activity data and the movement data, the sections including a refilling section, a stable section, and a draining section;

maintain the tank reading as a value of the initial water-level timeline for the refilling section and for the stable section;

filter the adjusted draining section to produce a smoothed water-level timeline for the water level in the tank during the watering mission;

compile an activities timeline for the water truck, the activities timeline comprising at least one of an activity code and a truck mode for a timestamp merged with the smoothed water-level timeline;

determine from the data snapshots spatial information of spraying activity for the water truck during the draining section;

generate a digitized reconstruction of the watering mission from the activities timeline and the spatial information of the spraying activity; and cause local control of the water truck during subsequent watering activity based, at least in part, on the digitized reconstruction.

16. The non-transitory computer-readable storage medium of claim 15, wherein the activity code represents a combination of the movement data, the water level, and the spraying activity at a respective timestamp.

17. The non-transitory computer-readable storage medium of claim 15, wherein the truck mode represents the status of the water-dispensing elements on the water truck at a respective timestamp.

18. The non-transitory computer-readable storage medium of claim 15, wherein determining spatial information of spraying activity for the water truck causes the one or more processors to:

identify spray geometries for the water-dispensing elements indicated by the water-activity data as being active; and assign the spray geometries to the corresponding ones of the water-dispensing elements for the data snapshots.

19. The non-transitory computer-readable storage medium of claim 18, having further instructions stored thereupon which, when executed, cause the one or more processors to:

aggregate the spray geometries across some of the data snapshots to form a spatiotemporal event.

20. The non-transitory computer-readable storage medium of claim 19, having further instructions stored thereupon which, when executed, cause the one or more processors to:

accumulate the spatiotemporal events along a movement path of the water truck to form a coverage map for the watering mission.

* * * * *